(12) United States Patent
Fuchs et al.

(10) Patent No.: US 11,605,843 B2
(45) Date of Patent: Mar. 14, 2023

(54) MECHANISM FOR ELECTRICALLY CONTACTING A PRINTED CIRCUIT BOARD TO A BATTERY CELL COMPOSITE SYSTEM, AND DEVICE COMPRISING SUCH A MECHANISM, AND SUCH A BATTERY CELL COMPOSITE SYSTEM

(71) Applicant: Triathlon Batterien GmbH, Glauchau (DE)

(72) Inventors: Viktor Fuchs, Gelsenkirchen (DE); Uwe Zimmermann, Lichtenstein (DE)

(73) Assignee: Triathlon Batterien GmbH, Glauchau (DE)

( * ) Notice: Subject to any disclaimer, the term of this patent is extended or adjusted under 35 U.S.C. 154(b) by 47 days.

(21) Appl. No.: 17/048,347

(22) PCT Filed: Apr. 16, 2019

(86) PCT No.: PCT/EP2019/059735
§ 371 (c)(1),
(2) Date: Oct. 16, 2020

(87) PCT Pub. No.: WO2019/206730
PCT Pub. Date: Oct. 31, 2019

(65) Prior Publication Data
US 2021/0184281 A1 Jun. 17, 2021

(30) Foreign Application Priority Data
Apr. 23, 2018 (DE) .................... 10 2018 206 231.5

(51) Int. Cl.
*H01M 10/48* (2006.01)
*H01M 50/502* (2021.01)
(Continued)

(52) U.S. Cl.
CPC ....... *H01M 10/486* (2013.01); *H01M 50/502* (2021.01); *H01R 4/34* (2013.01);
(Continued)

(58) Field of Classification Search
CPC .......... H05K 2201/10037; H05K 2201/10189; H05K 2201/10409; H05K 1/18;
(Continued)

(56) References Cited

U.S. PATENT DOCUMENTS

| 2011/0081568 A1* | 4/2011 | Kim ................... H01M 50/543 429/158 |
| 2012/0244397 A1* | 9/2012 | TenHouten ......... H01M 10/486 429/61 |

(Continued)

FOREIGN PATENT DOCUMENTS

| CN | 102369793 A | 3/2012 |
| CN | 107534112 A * | 1/2018 .......... H01M 10/425 |

(Continued)

*Primary Examiner* — Abdullah A Riyami
*Assistant Examiner* — Nader J Alhawamdeh
(74) *Attorney, Agent, or Firm* — McGlew and Tuttle, P.C.

(57) ABSTRACT

A mechanism for electrically contacting a printed circuit board to a battery cell composite system comprises a printed circuit board, at least one bimetallic element which is fastened to the printed circuit board, at least one cell connector for connecting the battery cell composite system to the printed circuit board, wherein the cell connector contacts the at least one bimetallic element with a connecting element, and a fastening element for fastening the connecting element to the at least one bimetallic element.

20 Claims, 3 Drawing Sheets

(51) Int. Cl.
*H01R 4/34* (2006.01)
*H01R 12/51* (2011.01)
*H05K 1/18* (2006.01)

(52) U.S. Cl.
CPC ............. *H01R 12/515* (2013.01); *H05K 1/18* (2013.01); *H05K 2201/10037* (2013.01); *H05K 2201/10189* (2013.01); *H05K 2201/10409* (2013.01)

(58) Field of Classification Search
CPC ..... H01R 12/515; H01R 4/34; H01M 50/502; H01M 10/486
See application file for complete search history.

(56) References Cited

U.S. PATENT DOCUMENTS

2016/0093863 A1\* 3/2016 DeKeuster .......... H01M 50/507
    429/121
2018/0108898 A1\* 4/2018 Shoji ................... H01M 50/502
2021/0184281 A1\* 6/2021 Fuchs ................. H01M 10/486

FOREIGN PATENT DOCUMENTS

| CN | 107534112 A | 1/2018 | |
| DE | 102010022689 A1 | 12/2011 | |
| DE | 112015005087 T5 | 9/2017 | |
| FR | 3047616 A3 * | 8/2017 | .......... H01M 10/425 |
| JP | 3212318 U | 9/2017 | |
| WO | 2012171071 A1 | 12/2012 | |

\* cited by examiner

MECHANISM FOR ELECTRICALLY CONTACTING A PRINTED CIRCUIT BOARD TO A BATTERY CELL COMPOSITE SYSTEM, AND DEVICE COMPRISING SUCH A MECHANISM, AND SUCH A BATTERY CELL COMPOSITE SYSTEM

This application claims the priority of German Patent Application Serial No. DE 10 2018 206 231.5, filed on Apr. 23, 2018, pursuant to 35 U.S.C. 119(a)-(d), the content of which is incorporated herein by reference in its entirety as if fully set forth herein.

FIELD OF THE INVENTION

The invention relates to a mechanism for electrically contacting a printed circuit board to a battery cell composite system as well as to a device with such a mechanism and a battery cell composite system.

BACKGROUND OF THE INVENTION

It is known that battery cells of a battery cell composite system are connected by means of at least one cell connector. Battery cell composite systems of this type are known from US 2016/0093863 A1, DE 11 2015 005 087 T5 and from DE 10 2010 022 689 A1, for example. Wire strands serve to electrically contact the battery cell composite system with an electrical printed circuit board, which wire strands are contacted to the printed circuit board and to the cell connector by means of insulation displacement technology or by a solder connection, for example. Electrically contacting the wire strands with the cell connector can take place by means of friction welding, wherein an additional passivating step is required in order to isolate the atmosphere, in particular the humidity. The contact method with a welded strand is complex and expensive.

SUMMARY OF THE INVENTION

An object of the present invention is to improve the electrical contact of a printed circuit board to a battery cell composite system, in particular to simplify the establishment of the contact and in particular to configure the contact itself to be robust.

This object is achieved according to the invention by a mechanism for electrically contacting a printed circuit board to a battery cell composite system, wherein the mechanism has a printed circuit board, at least one bimetallic element which is fastened to the printed circuit board, at least one cell connector for connecting the battery cell composite system to the printed circuit board, wherein the cell connector contacts the at least one bimetallic element with a connecting element and a fastening element for fastening the connecting element to the at least one bimetallic element.

This object is further achieved by a device having a mechanism according to the invention and a battery cell composite system which has a plurality of battery cells and which is connected to the printed circuit board by means of the at least one cell connector.

According to the invention, it has been recognized that a bimetallic element which is fastened to the printed circuit board simplifies the electrical contacting of a cell connector. The establishment of the electrical contact is simplified. The electrical contact is configured to be robust.

It has been found that the complex manufacturing according to the prior art is essentially justified by the fact that different materials have to be contacted and connected with one another, in particular copper, which can be used for the wire strand, and aluminum, which can be used for a cell connector. The bimetallic element is a composite component made from at least two different materials, in particular from copper and aluminum. Gold, silver or beryllium can also be used for the bimetallic element, instead of copper.

In particular, the bimetallic element has a first layer of a first material, in particular copper, and a second layer of a second material, in particular aluminum. The two material layers are superimposed. In particular, the material layers are designed in the form of annular discs. The two layers are reliably connected to one another and make it possible for the layers to be electrically contacted to one another. The bimetallic element is robust and in particular is designed in one piece as a disc. In particular, the bimetallic element is available as a semi-finished product in the form of a purchased part.

According to the invention, it has been recognized that the bimetallic element, on the one hand, makes it possible to advantageously couple the different materials of the cell connector and, on the other hand, enables the connection to the printed circuit board, in particular the conducting material of the printed circuit board, which in particular is copper. The use of a strand, in particular a copper strand, can be dispensed with.

The printed circuit board comprises in particular a support material which is also described as a substrate which in particular is coated at least in sections on a surface by the conducting material. The conducting material is in particular copper and in particular electrically and/or thermally conductive. The conducting material fixes at least one conductor track on an external surface of the printed circuit board to the support material.

In particular, the printed circuit board has a plurality of bimetallic elements which are fastened to the printed circuit board, in particular soldered, welded and/or press-fitted. The bimetallic element can be fastened to the printed circuit board in particular in an automated manner.

The battery cell composite system is connected to the printed circuit board, in particular to the conducting material, via the cell connector. It is also conceivable that a plurality of cell connectors are provided. In particular, a cell connector is contacted with a bimetallic element in each case. For this purpose, the cell connector can abut against and/or bear on the bimetallic element. The cell connector has a connecting element which in particular is designed in an integrated manner. The connecting element is in particular finger-like in design and is in particular designed in the form of a connecting tab.

The connecting element is fastened to the at least one bimetallic element by means of a fastening element. The fastening element can be a screw, in particular with a metric external thread. The use of a screw which has a screw head with an increased contact surface has proven to be particularly advantageous. In particular, the contact surface on the underside of the screw head is larger than the contact surface of a hexagonal screw head of a metric screw. This makes a reduced surface pressure under the screw head possible, in particular between the screw head and the cell connector. In particular, this prevents a plastic material deformation, in particular of the cell connector, from occurring under the screw head. This is in particular advantageous because the cell connector can be produced from a material with relatively low hardness, such as pure aluminum, for example. Corrosion protection is increased, owing to the fact that damage to the surface on the cell connector is substantially precluded. The large diameter of the underside of the screw head ensures a compensation of tolerances, in particular when covering elongated holes. Owing to the large contact surface, an increased effective friction surface is established between the fastening element and the cell connector, whereby the safety against unscrewing is increased, in particular in an automated torque-controlled tightening of the fastening element. In particular, the underside of the screw head is designed to be uneven. When the screw is tightened, the disc-shaped screw head is elastically deformed and, as a result, a permanent prestressing of the fastening element on the cell connector is ensured. In particular, additional securing elements, such as a spring and/or a snap ring, for example, can be dispensed with. A fastening element which is advantageously used is distributed by the company Bossard AG under the trademark Ecosyn®.

The fastening element can have a high-strength thread coating. The thread coating has a high temperature resistance of −60° C. to 170° C. according to DIN 267-27. The thread coating can set the thread friction coefficient. Advantageously, the thread friction coefficient is between 0.10 and 0.15. The screw-in torque remains substantially unchanged by the coating. The unscrewing torque is increased. In particular, a screw which is coated with the thread coating is suitable for blocking counter-pressures of up to 400 bar. The high-strength thread coating is reliably designed as a captive component of the thread of the fastening element. According to the exemplary embodiment shown, the thread coating can additionally serve as an adhesive which is screwed in together with the fastening element. The fastening element which is coated in this way is in particular suitable for using in the case of high shock vibration requirements. The coating material is similar to lacquer and is solvent free. It is a reactive coating based on microencapsulated acrylates for securing and sealing thread parts. The coating material is dry, non-slip and is suitable for every kind of assembly process, in particular in mass production. During assembly, i.e. when screwing in the fastening element, microcapsules in which the acrylate is stocked are destroyed by pressure and/or shear stresses. The components which are released are mixed together and harden during assembly.

A high-strength thread coating of this type is provided by the company omniTECHNIK Mikroverkapselungs GmbH under the trademark Precote® 85, for example.

The contact of the cell connector to the bimetallic element is ensured. The contact between the cell connector and the bimetallic element is robust. The connection and contact of the bimetallic element to the printed circuit board is robust.

A mechanism, wherein the fastening element has a fastening thread, in particular an external thread and in particular a metric external thread, makes it possible to fasten the connecting element to the bimetallic element in a defined manner. In particular, fastening takes place in a releasable manner. The connecting element can be fastened to the bimetallic element in an automated manner. The fastening element, which has a fastening thread, can be screwed in in an automated process, for example by means of a defined screw-in torque. This makes quality control possible when fastening the connecting element to the bimetallic element.

A design of the bimetallic element, wherein the at least one bimetallic element has a through-opening for plugging through the fastening element, enables a simplified connection with the fastening element. Owning to the fact that the bimetallic element has a through-opening, the fastening element can be plugged through the bimetallic element without mechanical resistance during fastening. In particular, the bimetallic element is disk-shaped, in particular is designed in the form of an annular disc and/or in the form of a U disc.

A mating fastening element which cooperates with the fastening element, said mating fastening element having in particular a mating fastening thread, in particular an internal thread, in particular a metric internal thread, which cooperates with the fastening thread of the fastening element, makes it possible to fasten the connecting element to the bimetallic element in a defined and in particular repeatedly releasable manner. In particular, a nut serves as a mating fastening element, which nut is attached to the printed circuit board, in particular to an underside which is opposite the bimetallic element.

The design of the mating fastening element configured such that said mating fastening element is fastened to the printed circuit board, enables a robust manufacturing process, in particular in the case of connecting the cell connector to the printed circuit board. In particular, the mating fastening element is welded, soldered and/or press-fitted on the printed circuit board. It is also conceivable that the mating fastening element is only fixed to the printed circuit board, wherein the actual fastening of the mating fastening element to the printed circuit board is carried out by fastening it to the fastening element, in particular by screwing it to the fastening thread which engages with the mating fastening thread.

Alternatively to an additional mating fastening element, the fastening element can also be directly fastened in the printed circuit board itself. It is conceivable that the fastening element has a fastening thread in the form of a cutting thread, which is screwed directly into the printed circuit board for mechanical fastening. In order to avoid mechanical damage to the printed circuit board, for example through tearing or jumping, the printed circuit board can be pre-drilled.

The arrangement of the connecting element such that it protrudes, in particular from an outer edge of the cell connector, simplifies fastening to the printed circuit board.

The design of the connecting element such that the connecting element has a connecting surface, by means of which the connecting element contacts the at least one bimetallic element, ensures sufficient and electrically robust contact with the bimetallic element.

The design of the connecting element configured such that it is finger-like in design, makes it possible to design the cell connector in a material-friendly and space-efficient manner.

The design of the connecting element configured such that the connecting element has a through-opening for the fastening element to pass through, makes it possible to fasten the fastening element in a simplified and direct manner.

A supporting frame on which the printed circuit board is held, in particular along its periphery, serves to mechanically stabilize the mechanism.

A device having a mechanism according to the invention and a battery cell composite system which has a plurality of battery cells and which is connected to the printed circuit board by means of the at least one cell connector, essentially has the advantages of the mechanism, to which reference is hereby made. A plurality of battery cells, in particular lithium-ion batteries, can be contacted to the mechanism. The battery cells are arranged in a battery cell composite system and are connected to one another. The connection to the printed circuit board of the mechanism takes place by means of the cell connector. The battery cells can be connected in series or in parallel in the battery cell composite system.

A device comprising a control unit which is arranged in particular at the battery cell composite system, makes it possible to operate the battery cell composite system in a secure, reliable and risk-free manner. The control unit has in particular an electronic control system which in particular serves to measure voltages in the battery cells, to measure the temperature of the battery cells and/or to equalize the charges in the case of different states of charge of the battery cells.

In addition, a device configured such that the battery cell composite system is fastened to the supporting frame, is mechanically stabilized.

A device comprising at least one temperature sensor which is arranged in particular adjacent to the at least one bimetallic element, enables temperature monitoring, in particular at the fastening points, i.e. in the region of the bimetallic elements.

A device configured such that the at least one temperature sensor is fastened to the at least one bimetallic element and to the printed circuit board, enables temperature detection at the cell poles.

An exemplary embodiment of the invention is explained in greater detail hereinafter using the drawings.

DESCRIPTION OF THE PREFERRED EMBODIMENT

Figure 1:
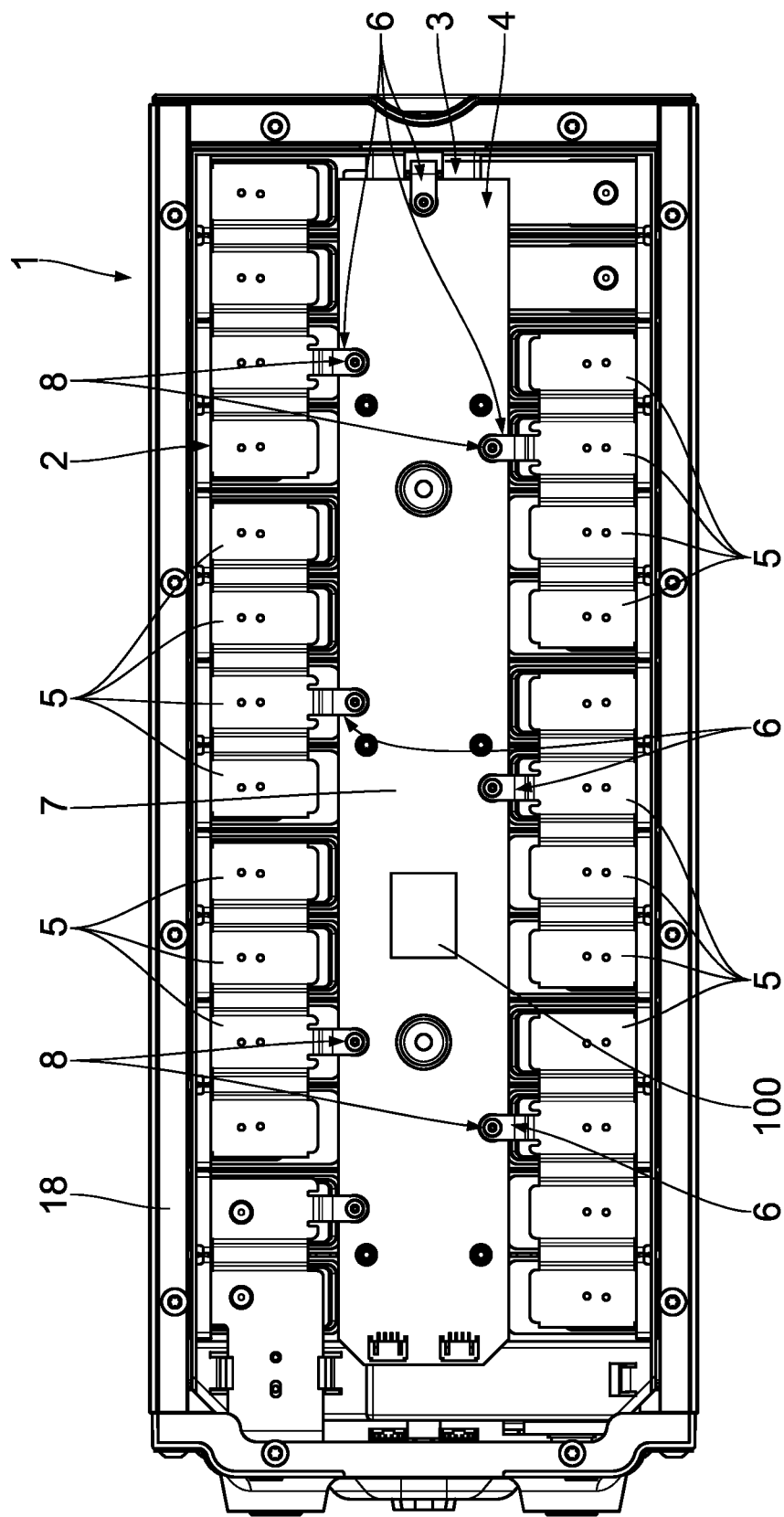
FIG. 1 shows a plan view of a device with a mechanism according to the invention.
Figure 2:
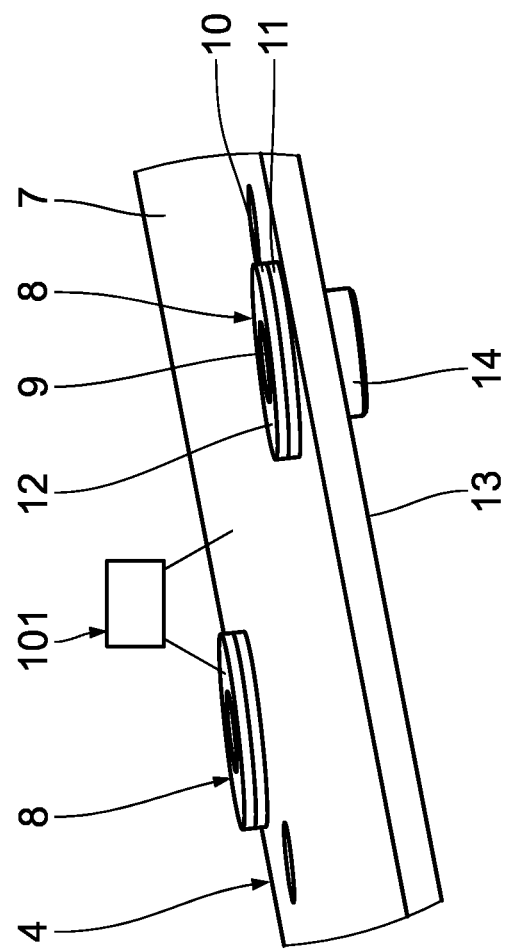
FIG. 2 shows a perspective view of a printed circuit board of the mechanism without a fastened cell connector.

A device which is identified in its entirety with 1 in FIG. 1 comprises a battery cell composite system 2 and a mechanism, identified as a whole with 3, for electrically contacting a printed circuit board 4 to the battery cell composite system 2.

The battery cell composite system 2 has a plurality of lithium-ion battery cells 5 which in each case are combined and fastened to the printed circuit board 4 by means of a cell connector 6. According to the exemplary embodiment, eight cell connectors 6 are provided in order to combine the battery cells 5 into groups of four battery cells 5 in each case, for example, and to connect them to the printed circuit board 4, i.e. to electrically contact them.

The battery cell composite system 2 comprises a control unit 100 which is in-tegrated on the printed circuit board 4 and in particular comprises an elec-tronic control system. The electronic control system can in particular be in signal communication with temperature sensors 101, in order to detect thermal load at the printed circuit board 4 and in particular in the region of the cell connector 6. The elec-tronic system can also be used for equalizing the charges of the individual battery cells 5. The electronic system is in signal communication with the battery cells 5.

The printed circuit board 4 comprises a support material, in particular as a substrate, for example in the form of an epoxy resin, wherein the support material is coated with a conducting material, copper according to the exemplary embodiment shown, at least in sections. The conducting material is electrically and/or thermally conductive and forms in particular conductor tracks on a surface of the printed circuit board 4.

A bimetallic element 8 is provided for each of the cell connectors 6 on a surface 7 of the printed circuit board 4 shown in FIG. 1 for fastening the cell connector 6. According to the exemplary embodiment shown, the bimetallic elements 8 are designed as composite components. The bimetallic elements represent an integral connection of two different materials, in particular of two different metals. According to the exemplary embodiment shown, the bimetallic elements 8 are designed as copper-aluminum composite components which are described as Cupal elements.

According to the exemplary embodiment shown, the bimetallic elements 8 are each designed as annular discs with a through-opening 9.

The bimetallic element 8 has a first aluminum layer 10 and a copper layer 11 which is connected thereto. The bimetallic element 8 is arranged on and fastened to the printed circuit board 4 in such a way that the copper layer 11 directly contacts the printed circuit board 4 and in particular the conducting material of the printed circuit board 4. The bimetallic element 8 is soldered, welded or press-fitted on the printed circuit board 4. The aluminum layer 10 is arranged on a surface of the copper layer 11 which is opposite the printed circuit board 4. The aluminum layer 10 serves to contact and fasten the cell connector 6. The bimetallic element 8 has a contact surface 12 which is shaped like an annular disc on the surface which faces away from the printed circuit board 4. The contact surface 12 is designed on the aluminum layer 10, in particular arranged on the free surface of the aluminum layer 10.

A mating fastening element 14 which corresponds to the bimetallic element 8 is arranged on the underside 13 opposite the surface 7 of the printed circuit board 4 in the form of a threaded sleeve. The mating fastening element 14 has an internal thread, in particular a metric internal thread, which is arranged in alignment relative to the through-opening 9 of the bimetallic element 8. The printed circuit board 4 has a corresponding, aligned opening.

The threaded sleeve 14 is at least fixed and in particular fastened, for example welded, soldered and/or press-fitted, on the underside 13 of the printed circuit board 4. This ensures that the mating fastening element 14 does not become unintentionally detached during the manufacturing process, i.e. while the cell connector 6 is being contacted to the printed circuit board 4. The mating fastening elements 14 are reliably held on the printed circuit board 4 during the manufacturing process.

Figure 3:
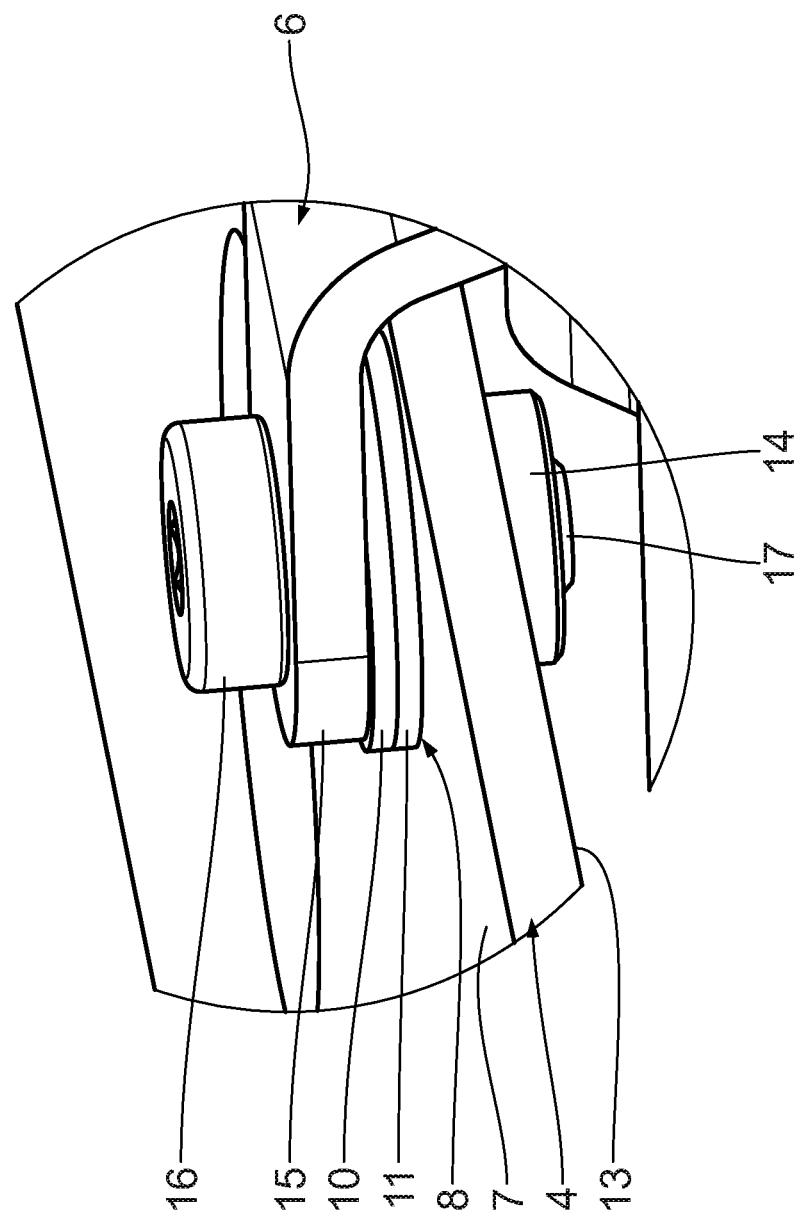
FIG. 3 shows an enlarged perspective representation of the device with a connecting element which is fastened to a bimetallic element by means of a fastening element.

As represented in FIG. 3, the cell connector 6 has a finger-shaped, in particular tab-like connecting element 15. The connecting element 15 protrudes from an outer edge of the cell connector 6 and can thus be connected to the printed circuit board 4 and the bimetallic element 8 arranged there in a direct and straightforward manner. The battery cells 5 are arranged substantially laterally in oppositely arranged rows at the printed circuit board 4. The connecting elements 15 of the cell connectors 6 project beyond the sides of the printed circuit board 4 like clamps. The connecting elements 15 form an additional connecting layer which can bear directly on the bimetallic element 8.

A fastening element 16 serves to fasten the connecting elements 15 to the respective bimetallic elements 8, which fastening element is designed as a metric screw according to the exemplary embodiment shown. The screw has a fasten-ing thread 17 which cooperates with the mating connecting element 14 and which is designed in particular as a metric external thread and engages with a metric internal thread of the mating fastening element 14 which is not represented. Fastening the cell connector 6 to the printed circuit board 4 via the bimetallic element 8 is straightforward and mechanically robust. In particular, the connection, in particular the electrical contact, can be made repeatably accurately and in an automatable manner Manufacturing a device of this type, in particular fastening the battery cell composite system 2 to the printed circuit board 4, is simplified. The production method can be carried out in a robust and reliable manner.

The electrical contact of the cell connector 6 to the aluminum layer 10 of the bimetallic element 8 with the connecting element 15 made from aluminum is improved as a result. The electrical and thermal contact within the bimetallic element 8 is ensured. The contact of the bimetallic element 8 to the printed circuit board 4 with the copper layer 11 is made in a reliable and robust manner.

According to the exemplary embodiment shown, the printed circuit board 4 is held in a supporting frame 18, in particular along its periphery, i.e. mechanically fixed. The supporting frame 18 provides the mechanism 3 with additional mechanical stability. The supporting frame 18 can also serve to additionally hold and to stabilize the battery cell composite system 2.

The electrical connection is made in a defined manner by contacting the cell connector 6 with the printed circuit board 4 via the bimetallic element 8.

Owing to the fact that the transition from aluminum to copper through the aluminum layer 10 and the copper layer 11 is integrated within the bimetallic element 8, material-specific problems do not occur. In particular, corrosion between the materials does not occur. The connection of the bimetallic element 8 to the printed circuit board is made in a reliable manner and in a manner which is suitable for mass production.

The invention claimed is:

1. A mechanism for electrically contacting a printed circuit board to a battery cell composite system, the mechanism comprising:
   the printed circuit board;
   at least one bimetallic element which is fastened to the printed circuit board, wherein the at least one bimetallic element is a composite component made from at least two different materials, wherein the bimetallic element is configured in one piece;
   at least one cell connector for connecting the battery cell composite system to the printed circuit board, wherein the at least one cell connector contacts the at least one bimetallic element with a connecting element; and
   a fastening element for fastening the connecting element to the at least one bimetallic element.

2. The mechanism as claimed in claim 1, wherein the fastening element has a fastening thread.

3. A mechanism for electrically contacting a printed circuit board to a battery cell composite system, the mechanism comprising:
   the printed circuit board;
   at least one bimetallic element which is fastened to the printed circuit board;
   at least one cell connector for connecting the battery cell composite system to the printed circuit board, wherein the at least one cell connector contacts the at least one bimetallic element with a connecting element; and
   a fastening element with which the connecting element is fastened to the at least one bimetallic element; wherein the at least one bimetallic element has a through-opening through which the fastening element is plugged.

4. A mechanism for electrically contacting a printed circuit board to a battery cell composite system, the mechanism comprising:
   the printed circuit board;
   at least one bimetallic element which is fastened to the printed circuit board;
   at least one cell connector for connecting the battery cell composite system to the printed circuit board, wherein the cell connector contacts the at least one bimetallic element with a connecting element;
   a fastening element with which the connecting element is fastened to the at least one bimetallic element, wherein the fastening element has a fastening thread; and
   a mating fastening element which cooperates with the fastening element.

5. The mechanism as claimed in claim 4, wherein the mating fastening element is fastened to the printed circuit board.

6. The mechanism as claimed in claim 1, wherein the connecting element protrudes.

7. The mechanism as claimed in claim 1, wherein the connecting element has a connecting surface, by means of which the connecting element contacts the at least one bimetallic element.

8. The mechanism as claimed in claim 1, wherein the connecting element has a finger configuration.

9. The mechanism as claimed in claim 1, wherein the connecting element has a through-opening for the fastening element to pass through.

10. The mechanism as claimed in claim 1, further comprising a supporting frame on which the printed circuit board is held.

11. A device comprising:
    a mechanism for electrically contacting a printed circuit board to a battery cell composite system, the mechanism comprising: a printed circuit board; at least one bimetallic element which is fastened to the printed circuit board; wherein the at least one bimetallic element is a composite component made from at least two different materials, wherein the bimetallic element is configured in one piece;
    at least one cell connector for connecting the battery cell composite system to the printed circuit board, wherein the at least one cell connector contacts the at least one bimetallic element with a connecting element; and a fastening element for fastening the connecting element to the at least one bimetallic element; and
    the battery cell composite system which has a plurality of battery cells and which is connected to the printed circuit board by means of the at least one cell connector.

12. The device as claimed in claim 11, further comprising a control unit.

13. The device as claimed in claim 11, wherein the battery cell composite system is fastened to the supporting frame.

14. The device as claimed in claim 11, further comprising: at least one temperature sensor which is arranged adjacent to the at least one bimetallic element.

15. The device as claimed in claim 14, wherein the at least one temperature sensor is fastened to the at least one bimetallic element and to the printed circuit board.

16. The device as claimed in claim 11, further comprising at least one temperature sensor.

17. The mechanism according to claim 1, wherein the mating fastening element has a mating fastening thread, which cooperates with the fastening thread of the fastening element.

18. The mechanism according to claim 1, wherein the connecting element protrudes from an outer edge of the cell connector.

19. The device as claimed in claim 11, wherein
the printed circuit board comprises a conducting material portion providing at least a portion of a printed circuit board surface, the conducting material portion being formed of a circuit board conducting material;
the connecting element comprises a contact surface formed of a material different from the circuit board conducting material;
one of the at least two different materials of the bimetallic element is the circuit board conducting material;
the bimetallic element further comprises:
  a cell connector contact surface formed of one of the at least two different materials that is different from the circuit board conducting material; and
  a printed circuit board contact surface formed of the circuit board conducting material;
the at least one cell connector contacts the at least one bimetallic element with the connecting element contact surface in contact with the cell connector contact surface of the bimetallic element, and
the printed circuit board contacts the at least one bimetallic element with the printed circuit board contact surface in contact with the conducting material portion of the bimetallic element.

20. The mechanism according to claim 19, further comprising a mating fastening element which cooperates with the fastening element, wherein:
the at least one bimetallic element has a through-opening through which the fastening element is inserted;
the fastening element has a fastening thread;
the mating fastening element is fastened to the printed circuit board; and
the mating fastening element has a threaded sleeve is arranged in alignment relative to the through-opening of the bimetallic element and with an internal thread engaged with the fastening thread.

\* \* \* \* \*